United States Patent
Hortaleza et al.

[11] Patent Number: 5,984,162
[45] Date of Patent: Nov. 16, 1999

[54] ROOM TEMPERATURE BALL BONDING

[75] Inventors: Edgardo R. Hortaleza, Garland; Timothy J. Hogan, Allen, both of Tex.

[73] Assignee: Texas Instruments Incorporated, Dallas, Tex.

[21] Appl. No.: 08/806,964

[22] Filed: Feb. 26, 1997

[51] Int. Cl.$^6$ .................................................. B23K 20/10
[52] U.S. Cl. ........................................ 228/110.1; 228/1.1
[58] Field of Search ................................... 228/1.1, 110.1

[56] References Cited

U.S. PATENT DOCUMENTS

| | | | |
|---|---|---|---|
| 5,186,378 | 2/1993 | Alfaro | 228/1.1 |
| 5,201,453 | 4/1993 | Amador et al. | 228/1.1 |
| 5,201,454 | 4/1993 | Alfaro et al. | 228/4.5 |
| 5,244,140 | 9/1993 | Ramsey et al. | 228/1.1 |
| 5,660,319 | 8/1997 | Falcone et al. | 228/1.1 |

OTHER PUBLICATIONS

Hogan, Timothy J. And Edgardo R. Hortaleza, "Low Temperature Gold Ball Bonding for Micro–mechanical Device Interconnect" Oct. 11, 1995 –10 pages –presentation to Edison Welding Institute.

ESEC Wirebond Process Research and Development, "Room Temperature Bonding Using Higher Frequencies" *Precision Viewpoints*, May 1995, Issue 2, pp. 1–3.

Patent Application filed by Texas Instruments Incorporated, Docket No. 19617 "Ultrasonic Bonding Process" filed on Jan. 17, 1995 by Falcone and Hogan, pp. 1–14 w/20 Figures (Now U.S Pat. 5,660,319).

K. Johnson et al., "Development of Aluminum Ball/Wedge Wire Welding," *Int. J. Hybrid Microelectronics*, vol. 4, No. 1 (Spring 1981) pp. 7–12.

*Primary Examiner*—Geoffrey S. Evans
*Assistant Examiner*—Jeffrey T. Knapp
*Attorney, Agent, or Firm*—Charles A. Brill; Frederick J. Telecky, Jr.; Richard L. Donaldson

[57] ABSTRACT

An apparatus (304) and method is provided for bonding wire (104) to bond sites (108) of integrated circuits (110), lead frames, and packages at room temperatures. In preferred embodiments a ball end (106) of a gold wire (104) is bonded to an aluminum bond pad (108). Apparatus (304) includes a high frequency ultrasonic energy source (306) designed to provide ultrasonic energy at frequencies above 200 kHz. The ultrasonic energy is transmitted to the bonding interface via capillary (302). In this manner, a strong bond is formed between ball end (106) and bonding site (108). The apparatus and method provided enable bonds of sufficient shear strength to be fabricated in a sufficiently short bonding time even at ambient temperatures, enabling the efficient fabrication of temperature sensitive devices such as micromechanical structures.

19 Claims, 2 Drawing Sheets

ROOM TEMPERATURE BALL BONDING

FIELD OF THE INVENTION

This invention relates to the field of integrated circuit (IC) interconnections. More particularly, it relates to IC interconnections utilizing high frequency ultrasonic energy, especially room-temperature IC interconnections utilizing high frequency ultrasonic energy.

BACKGROUND OF THE INVENTION

The standard technique for making circuit interconnections for semiconductor devices consists of bonding a wire, typically a gold or aluminum alloy wire, to an aluminum alloy bond pad on the semiconductor die. In the case of a gold wire, bond eventually results in an intermetallic structure of several possible phases, depending on time and temperature and dictated by diffusion behavior. The highest bond strength is obtained by maximizing the intermetallic coverage under the ball bond.

Clean surfaces, high temperatures, and the proper amount of pressure and mechanical scrubbing contribute to an optimum reaction between the gold and aluminum metals in the wire and bond pad. Ideally, a very short bonding time may be used to create the intermetallic bond between the surfaces. While satisfactory processes have been developed for many of the typical semiconductor devices, all of the processes, known as thermosonic bond processes, rely on elevating the temperature of the semiconductor device during the bonding process.

Unfortunately, micromechanical devices such as the Digital Micromirror Device (DMD) cannot tolerate the elevating temperature required by IC wire bonding processes of the prior art. Therefore, a room temperature wire bonding process is needed that will allow temperature sensitive devices such as the DMD to be fabricated without damaging the temperature sensitive structures.

SUMMARY OF THE INVENTION

The problems outlined above are in large measure solved by the method and apparatus in accordance with the present invention. That is to say the invention thereof provides a wire bonding process resulting in a sufficiently strong bond being formed at ambient temperatures. The invention provides these benefits utilizing high frequency ultrasonic energy with an optimized capillary.

According to one embodiment, the apparatus disclosed provides an ultrasonic source for vibrating a capillary tube at a frequency greater than 200 kHz, preferably at 235–245 kHz, and more preferably at 237 kHz, while a wire held in the capillary tube is pressed against a bonding site.

Generally, the invention provides a method of forming a wire bond, the method comprising the steps of pressing a wire interconnect against a semiconductor device pad with a capillary tube and vibrating the capillary tube at a frequency above 200 kHz to form an intermetallic bond between the wire interconnect and the semiconductor device pad.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The thermosonic bond process is a widely used method of obtaining a good bond between a wire interconnect, such as a gold wire, and bond pad of a semiconductor device. Generally, this process uses low frequencies of 60 kHz to 100 kHz and temperatures of around 175° to 300°. The present invention discloses a method of obtaining a sufficient bond between the wire interconnect and a semiconductor bond pad using increased bonding frequencies (greater than 200 kHz) and decreased temperatures (less than 100° C.). The apparatus disclosed has been optimized to maximize the intermetallic bonds formed while minimizing the bonding temperature. Using this process and apparatus, strong bonds are formed at room or ambient temperatures (10° to 50° C.). Furthermore, the low temperature bonding process taught herein minimizes the number of particles added during the bonding process. This is especially important when processing micromechanical devices that have moving parts, such as the DMD.

Figure 1:
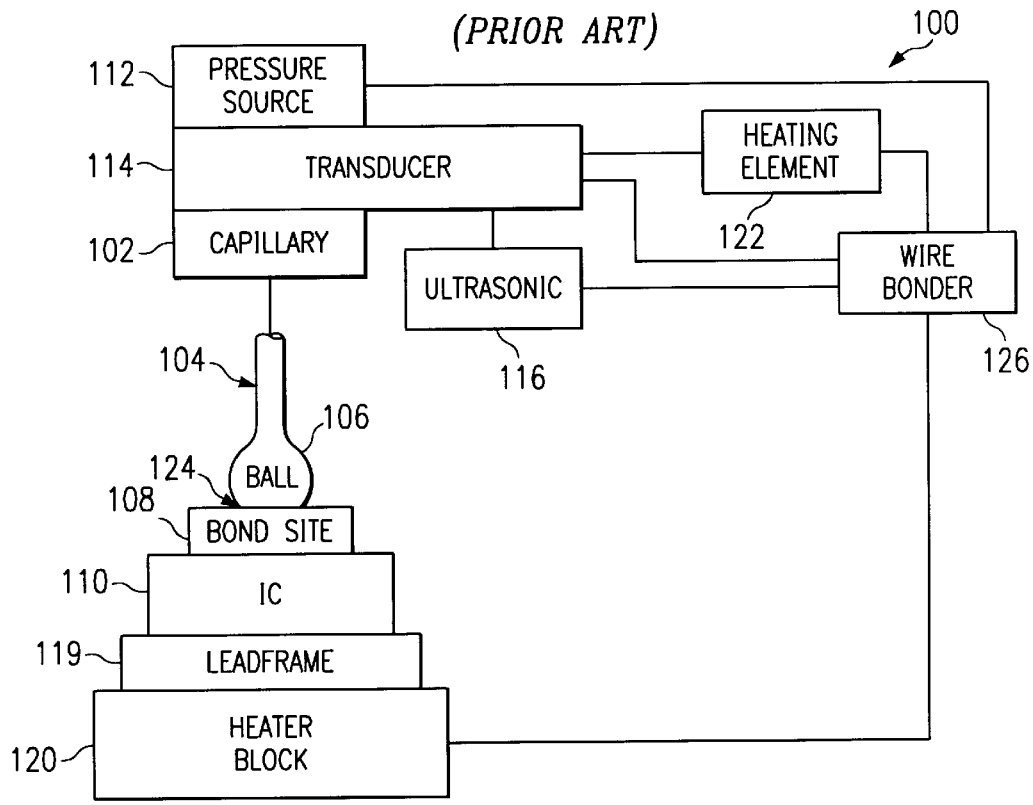
FIG. 1 is a schematic representation of a bonding apparatus used for bonding wire to a microelectronic integrated circuit according to the prior art.

Referring now to the drawings in general and FIG. 1 in particular, a schematic diagram of a typical wire bonder 100 of the prior art is shown. The bonder includes a capillary tube 102 which holds a bond wire 104. The bond wire is typically gold. To form a ball bond, the end of the wire is melted to form a ball 106, typically by exposing the end of the wire to a spark. The ball is then pressed against a bond pad or bond site 108 of a semiconductor device or IC 110 by a pressure source 112. While the ball 106 is pressed against the bond pad 108, the capillary 102, and the wire 102 and wire ball 106 held by the capillary 102, are vibrated at a low frequency by the ultrasonic transducer 114 which is driven by the ultrasonic source 116. At the same time the wire ball 106 is pressed against the bond pad 108, the IC 110, mounted on package or leadframe 119, and the bonder 100 are heated by heater block 120. Another thermal source, heating element 122, heats capillary 102 via transducer 114. The combination of the pressure, ultrasonic vibration, and heat cause the wire ball to bond to the bond pad at the interface 124. The remaining portion of the bonder is represented by block 126.

The IC 110 is any type of semiconductor device on which a bond pad 108 has been fabricated. Although any type of IC 110 is suitable, the disclosed process is optimized for bonding ICs 110 that are unable to withstand the typical bonding temperatures of 180° C., such as the DMD or other micromechanical devices. Typical ICs 110 all have a monocrystalline substrate with various metalization layers deposited thereon. The bond pad 108, or bonding site, is typically a small metal region on the perimeter of the IC 108 which is in electrical contact with the circuit fabricated on the IC 108. Typically the bond pad 108 is made substantially of an aluminum alloy, in particular an aluminum alloy containing about 2% copper, but virtually any other metal will work.

The wire 104 is typically 99.99% gold. Gold wires are preferred because the alternative room temperature process, aluminum wire ultrasonic wedge bonding tends to produce more particle contamination during the wire bonding process. Tests have shown a 10× decrease in particle contamination using gold ball bonding at room temperature compared to aluminum wedge bonding at room temperature. Additionally, softer gold wires form stronger bonds due to increased intermetallic formation. However, harder gold wire provide better control of the wire loop profile. Therefore the optimum gold wire type is a compromise between the soft and hard types. The actual wire selected may be a function of the particular package and integrated circuit being used since those factors determine the length of the wire loops required. Typically, the softest gold wire that allows adequate control of the wire loop profile will be used.

Figure 2:
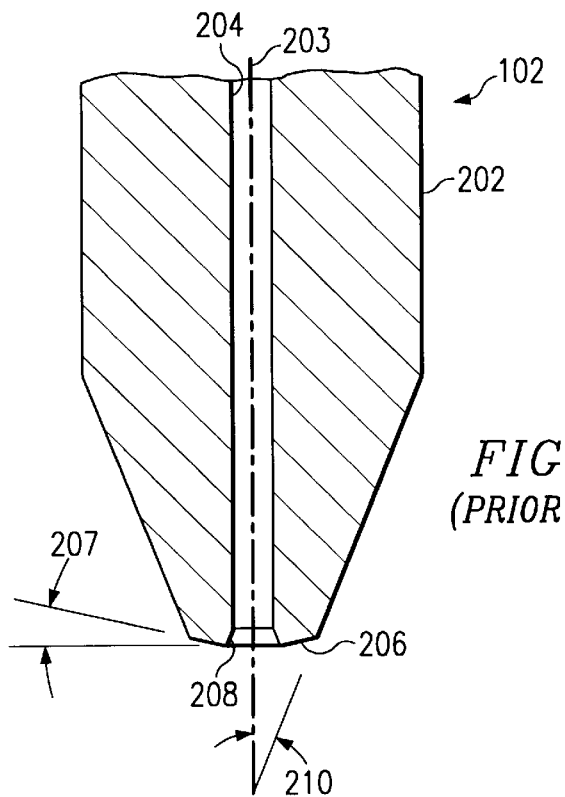
FIG. 2 is a sectional view of a prior art capillary tube used for bonding wire.

FIG. 2 shows a cross-sectional view of a wire bonding capillary 102 without a wire 104. The capillary body 202, typically a beryllium oxide or a ceramic material, encloses an inner conduit or bore 204 along a longitudinal axis 203 through which the bonding wire 104 (not shown in FIG. 2) passes. The capillary body 202 tapers to a face 206 at angle called the cone angle 210. The capillary shown in FIG. 2 has a straight taper, or cone, but capillaries are available that have a complex taper called a bottleneck. Although a cone capillary is preferred, a bottleneck capillary may also be used. The face 206 of the capillary is typically angled with respect to a plane normal to axis 203. Experimentation has shown that the optimum face angle 207 for the room temperature bonding process is between 4 and 11 degrees. More particularly, a face angle 207 of 8 degrees is desired.

The capillary includes a chamfer 208 at the intersection between the face 206 and the bore 204. The intersection of the chamfer 208 and face 206 surfaces reduces wire drag when the wire 104 is played out between the bonding pad 108 on the IC 110 and a similar bonding pad on a lead frame or ceramic package. Furthermore, the edge formed by the intersection of the chamfer 208 and the face 206 serves to cut or break the wire 104 after a stitch or wedge bond is formed on the lead frame.

Testing showed a strong interaction between the chamfer angle and the tail portion of the stitch bond. Because of the higher ultrasonic frequencies required for room temperature bonding, the amplitude of the capillary vibration is much greater than the vibration associated with bonding at elevated temperatures. The increased amplitude of vibration can prematurely cut the wire before a strong stitch bond is completed. Testing showed that a single larger chamfer angle is less likely to prematurely cut the tail of the stitch bond. Table 1 lists five types of capillaries tested and a summary of bond characteristics resulting from the use of each type.

TABLE 1

| Dimensions | Type 1 | Type 2 | Type 3 | Type 4 | Type 5 |
| --- | --- | --- | --- | --- | --- |
| Taper angle (deg.) | 20/cone | 20/btnk | 20/cone | 30/cone | 20/btnk |
| Tip Diameter (mils) | 9.0 | 6.0 | 9.4 | 8.0 | 8.0 |
| Outer radius (mils) | 1.5 | 1.5 | 1.8 | 1.5 | 1.5 |
| Hole diameter (mils) | — | — | — | 1.5 | 1.5 |
| Face angle (deg.) | 8.0 | 4.0 | 8.0 | 8.0 | 11.0 |
| finish type | polished | polished | polished | matte | matte |
| Chamfer-1 dia. (mils) | 3.5 | 2.5 | 3.3 | 2.6 | 3.0 |
| angle (deg.) | 120 | 90 | 150 | 150 | 120 |
| finish type | polished | polished | polished | matte | matte |
| Chamfer-2 dia. (mils) | n/a | n/a | 2.8 | 2.0 | 2.8 |
| angle (deg.) | n/a | n/a | 60 | 60 | 60 |
| finish type | n/a | n/a | polished | polished | polished |

TABLE 1-continued

| Findings/observations (0 = unacceptable, 1 = acceptable) | | | | | |
| --- | --- | --- | --- | --- | --- |
| Ball diameter | 0 | 1 | 0 | 1 | 1 |
| Stitch area | 1 | 0 | 1 | 1 | 1 |
| Cut stitch | 1 | 0 | 0 | 0 | 0 |

The tests summarized in Table 1 were performed using a 116 kHz ultrasonic source and a bonding temperature of 60° C. In order to reduce the bonding temperature to ambient temperatures, further studies were performed to determine the effect of capillary material, capillary geometry, lead plating metalization, and package cleaning procedures on the bond strength. The most important factor is the effect of increasing the ultrasonic frequency beyond 200 kHz. Furthermore, since frequency is inversely proportional to the amplitude of mechanical vibrations at the capillary tip, the higher frequency bonding offers additional margin against premature cutting during stitch bonding, even with a lower capillary chamfer angle. Additionally, a small capillary tip appears to magnify the effective amplitude of the ultrasonic vibration at the capillary tip.

The grain size of the ceramic capillaries also effected the bonding process. Tests showed that the bond strength increases as the grain size of a ceramic capillary is decreased. The optimum capillary has a 15° cone angle although capillaries with cone angles between 20° and 10° work well. The preferred capillary is manufactured by Small Precision Tools Inc., although other capillaries may also be used.

Figure 3:
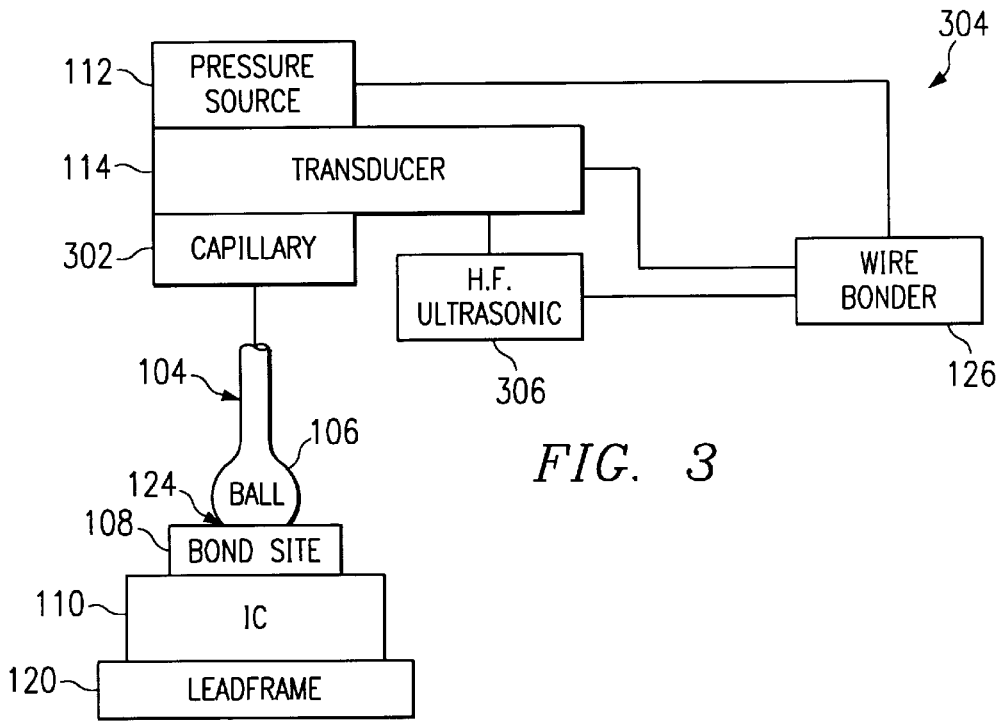
FIG. 3 is a schematic representation of an improved bonding apparatus used for bonding wire to a microelectronic integrated circuit pad at room temperature according to the present invention.

Existing wire bonders, such as the Abacus III bonder manufactured by Texas Instruments Incorporated of Dallas, Tex. or the K/S 1484 bonder manufactured by Kulicke & Soffa Industries, Inc., may easily be modified to allow the implementation of the bonding process taught herein. FIG. 3 shows a schematic diagram of the Abacus III bonder 304 after modification. For optimum performance, a ceramic capillary 302 having a cone angle between 10 and 20 degrees, a tip diameter between 5 and 8 mils, preferably between 6.0 and 6.5 mils, a hole diameter less than 2 mils, face angle between 4 and 8 degrees, a chamfer diameter of 2.5 to 3.0 mils, and a chamfer angle between 70 and 90 degrees is used. An ultrasonic source 306 capable of vibrating the capillary at a frequency above 200 kHz, more particularly in the range of 235 to 245 kHz, and ideally 237 kHz, is used.

Figure 4:
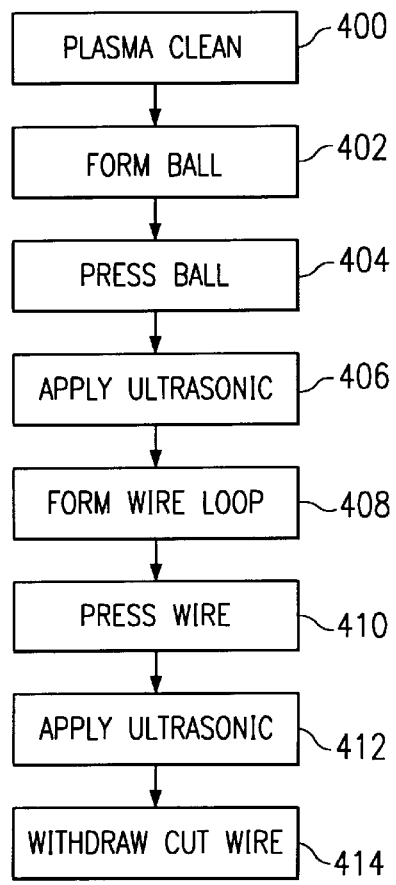
FIG. 4 is a flow chart showing the steps required to fabricate a room temperature bond using the improved bonding apparatus of FIG. 3.

The process of forming wire bonds using the modified bonder 304 parallels the process of the prior art, but uses a higher ultrasonic frequency, bond force or pressure, ultrasonic power, and a longer bond time. FIG. 4 is a flow chart showing the steps involved. In block 400 the bonding sites on the IC and the package or lead frame are subjected to a plasma cleaning process. In block 402 a ball is formed on the end of the bond wire using an electric spark. The ball is then pressed against the bonding pad in block 404 with a static force of 30 to 40 grams. Compared to the prior art bond process using a 290° C. bonding temperature, the pressure is decreased 30%. The ultrasonic source is then turned on in block 406 using a power between 1.0 and 1.3 watts. Compared to the 290° C. prior art bond process, the ultrasonic power is increased 75%. After a sufficient bond time, usually 6 to 10 mSec, which is 40% longer than the 290° C. prior art bond time, the ultrasonic source is shut off, and the ball bond is complete.

After forming the ball bond, a wire loop is formed 408 between the ball bond site and the site on which to form a stitch bond. The wire trailing out of the capillary is once again pressed against the bonding site, this time on the lead frame or package in block 410. For a stitch bond, the bond pressure is increased 33% above the pressure required for a 290° C. stitch bond of the prior art to 40 to 50 grams. As the wire is pressed against the bonding site, the ultrasonic source is turned on using a power level of 1.2 to 1.4 watts, which is 70% above the level used for a 290° C. stitch bond of the prior art as shown in block 412. The stitch bond step 412 takes 30 ms, which is 50% longer than for stitch bonds of the prior art. The ultrasonic source is then turned off and the capillary, which has now cut the bonding wire, is withdrawn 414 leaving the completed stitch bond. Although a ball bond on the IC bonding site, and a stitch bond on the package bonding site is preferable, a stitch bond may be used on either or both end of the interconnection.

Thus, although there has been disclosed to this point a particular embodiment for a method of wire bonding at room temperature and an apparatus therefor, it is not intended that such specific references be considered as limitations upon the scope of this invention except in-so-far as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. An apparatus for bonding a wire interconnect to a semiconductor device, said apparatus comprising:
    a capillary tube having a longitudinal passage through which a wire interconnect may be passed;
    a high frequency transducer for imparting a vibration above 200 kHz to said capillary tube at a power of 1.0 to 1.3 watts; and
    a pressure source for pressing said capillary tube towards said semiconductor device.

2. The apparatus of claim 1 wherein said capillary tube has a cone angle of less than 20 degrees.

3. The apparatus of claim 1 wherein said capillary tube has a cone angle of between 20 and 10 degrees.

4. The apparatus of claim 1 wherein said capillary tube has a cone angle of 15 degrees.

5. The apparatus of claim 1 wherein said transducer imparts a vibration in the range of 235 to 245 kHz, inclusive, to said capillary tube.

6. The apparatus of claim 1 wherein said transducer imparts a vibration above 240 kHz to said capillary tube.

7. The apparatus of claim 1 wherein said capillary tube is ceramic.

8. A method of bonding a wire interconnect to a semiconductor device, said method comprising:
    pressing said wire interconnect against said semiconductor device with a capillary tube; and
    vibrating said capillary tube at a frequency above 200 kHz and at a power of 1.0 to 1.3 watts to form an intermetallic bond between said wire interconnect and said semiconductor device.

9. The method of claim 8 wherein said step of vibrating said capillary tube is performed using a capillary tube having a cone angle of less than 20 degrees.

10. The method of claim 8 wherein said step of vibrating said capillary tube is performed using a capillary tube having a cone angle between 20 and 10 degrees.

11. The method of claim 8 wherein said step of vibrating said capillary tube is performed using a capillary tube having a cone angle of 15 degrees.

12. The method of claim 8 wherein said step of vibrating said capillary tube is performed at a frequency in the range of 235 to 245 kHz, inclusive.

13. The method of claim 8 wherein said step of vibrating said capillary tube is performed at a frequency of 237 kHz.

14. The method of claim 1 wherein said step of vibrating said capillary tube is performed for a period of 6 to 10 msec.

15. The method of claim 8 wherein said step of pressing said wire interconnect against said semiconductor device is performed with a static force of 30 to 40 grams.

16. The method of claim 8 further comprising the steps of:
    pressing said wire interconnect against a package lead with said capillary tube; and
    vibrating said capillary tube at a frequency above 200 kHz to form an intermetallic bond between said wire interconnect and said package lead.

17. The method of claim 16 wherein said step of pressing said wire interconnect against a package lead is performed with static force of 40 to 50 grams.

18. The method of claim 16 wherein said step of vibrating said capillary tube to form an intermetallic bond between said wire interconnect and said package lead is performed at a frequency of 237 kHz.

19. The method of claim 16 wherein said step of vibrating said capillary tube to form an intermetallic bond between said wire interconnect and said package lead is performed at a power of 1.2 to 1.4 watts.

* * * * *

UNITED STATES PATENT AND TRADEMARK OFFICE
CERTIFICATE OF CORRECTION

PATENT NO. : 5,984,162
DATED : November 16, 1999
INVENTOR(S) : Edgardo R. Hortaleza and Timothy J. Hogan It is certified that error appears in the above-indentified patent and that said Letters Patent is hereby corrected as shown below:

Cover Page, insert Item [60] under Related U.S. Application Data

--Provisional Application No. 60/012,252 Feb. 26, 1996.--

Signed and Sealed this

Twentieth Day of March, 2001

*Attest:*

NICHOLAS P. GODICI

*Attesting Officer*     *Acting Director of the United States Patent and Trademark Office*